(12) United States Patent
Min et al.

(10) Patent No.: US 9,590,156 B2
(45) Date of Patent: Mar. 7, 2017

(54) LIGHT-EMITTING DEVICE PACKAGE AND METHOD OF MANUFACTURING THEREOF

(71) Applicant: LIGHTIZER KOREA CO., Seoul (KR)

(72) Inventors: Jae Sik Min, Anyang (KR); Jae Young Jang, Anyang (KR); Jae Yeop Lee, Anyang (KR); Byoung Gu Cho, Anyang (KR)

(73) Assignee: LIGHTIZER KOREA CO., Seoul (KR)

( * ) Notice: Subject to any disclaimer, the term of this patent is extended or adjusted under 35 U.S.C. 154(b) by 0 days.

(21) Appl. No.: 14/618,114

(22) Filed: Feb. 10, 2015

(65) Prior Publication Data

US 2016/0118559 A1    Apr. 28, 2016

(51) Int. Cl.
 *H01L 21/20*   (2006.01)
 *H01L 33/62*   (2010.01)
 (Continued)

(52) U.S. Cl.
 CPC ............ *H01L 33/62* (2013.01); *H01L 33/505* (2013.01); *H01L 33/508* (2013.01); *H01L 33/54* (2013.01); *H01L 33/56* (2013.01); *H01L 2933/005* (2013.01); *H01L 2933/0041* (2013.01); *H01L 2933/0066* (2013.01)

(58) Field of Classification Search
 CPC .......... H01L 21/02543; H01L 21/0245; H01L 21/0231; H01L 21/2007; H01L 21/3144; H01L 21/31675; H01L 23/62; H01L 23/488; H01L 23/4951; H01L 23/4952; H01L 23/53242; H01L 24/85; H01L 27/0814; H01L 29/6608; H01L 51/5296

USPC ...... 438/141, 91, 99, 602, 612; 257/79, 233, 257/292, 284, E21.006, E21.051, 257/E21.126, E21.127, E21.347, 257/E21.352, E21.366, E21.499, E21.503
 See application file for complete search history.

(56) References Cited

U.S. PATENT DOCUMENTS

2007/0063212 A1* 3/2007 Watanabe ........... H01S 5/02244
                                                    257/99
2010/0265167 A1* 10/2010 Kinoshita ............ G02B 6/4203
                                                    345/82

(Continued)

FOREIGN PATENT DOCUMENTS

KR        1020080070193        7/2008

*Primary Examiner* — David Nhu
(74) *Attorney, Agent, or Firm* — Madeline F. Schiesser; Keohane & D'Alessandro PLLC

(57) ABSTRACT

The present invention provides a light-emitting diode (LED) package including: a substrate on which a set of bonding pads are formed; an LED element configured to provide light of a predetermined wavelength region, having a set of chip pads formed on a top surface thereof and being attached on a top surface of the substrate; a set of gold wires connecting the bonding pads of the substrate with the chip pads of the LED element; a phosphor layer formed in a cap shape having side and top portions of a uniform thickness and being configured to surround sides and a top surface of the LED element while being spaced apart therefrom; and a filler disposed to fill a space formed between the phosphor layer and the LED element, wherein the LED element, the gold wires, and the bonding pads of the substrate are under the phosphor layer cap.

12 Claims, 2 Drawing Sheets

(51) Int. Cl.
*H01L 33/50* (2010.01)
*H01L 33/56* (2010.01)
*H01L 33/54* (2010.01)

(56) References Cited

U.S. PATENT DOCUMENTS

| 2011/0121326 A1* | 5/2011 | Tan | H01L 33/60 |
| | | | 257/88 |
| 2015/0311408 A1* | 10/2015 | Min | H01L 33/0095 |
| | | | 257/99 |

* cited by examiner

LIGHT-EMITTING DEVICE PACKAGE AND METHOD OF MANUFACTURING THEREOF

CROSS REFERENCE TO RELATED APPLICATION

The present application claims the benefit of Korean Patent Application No. 10-2014-0148279 filed in the Korean Intellectual Property Office on Oct. 25, 2014, the entire contents of which are incorporated herein by reference.

BACKGROUND OF THE INVENTION

1. Technical Field

The present invention relates to a light-emitting device package and a method of manufacturing thereof, and more specifically, to a light-emitting device package and a method of manufacturing thereof which can effectively suppress a hot spot phenomenon while effectively increasing a beam angle of a light source emitted from a light-emitting diode element.

2. Description of the Related Art

Recently, light-emitting devices manufactured by adding aluminum (Al) or indium (In) to gallium nitride (GaN) have become popular due to a long lifespan, low power consumption, superior brightness, and an eco-friendly factor not harmful to the human body and the like, as compared to conventional incandescent bulbs or the like. In particular, a light-emitting device, also known as a Light-Emitting Diode (LED), providing white light has been further in the spotlight.

Such a light-emitting device is used, for example, for illumination of an automotive vehicle, traffic lights, a backlight unit (BLU) of a liquid crystal display device or the like, owing to the advantages described above.

Recently, the MacAdam Ellipse Rule has been suggested as an index for evaluating whether or not color coordinates measured at an artificial light source are the same as color coordinates seen by the human eye. The MacAdam Ellipse Rule provides 4 steps of criteria. In the Americas, an artificial light source not complying with 3 steps of the MacAdam Ellipse Rule is not permitted to be sold. In order to satisfy 3 of the step criterion of the MacAdam Ellipse Rule, it is very important to reduce color deviation of white light.

Meanwhile, Korean Patent Publication No. 10-2008-0070193 discloses a phosphor film formed by applying a phosphorus material on the surface of a film of a resin material. When the phosphor film is attached to a light-emitting diode element, it is difficult to reduce color deviation of white light, since the phosphor film is not effectively attached at a desired position due to electrostatic force or adhesive force generated between the phosphorus material and the film of a resin material. As a result, there is a problem of reliability since adhesive force between the LED element and the phosphor film is poor. In addition, an LED element employing the phosphor film uses a lead frame, and since a light-emitting region is limited due to reflection at side walls of the lead frame, a hot spot phenomenon of a narrow beam angle and concentrated luminance is intensified.

SUMMARY OF THE INVENTION

The present invention has been made in view of the above-identified difficulties discovered by the inventors. It is an object of the present invention to provide a light-emitting device package that can effectively suppress a hot spot phenomenon while effectively increasing a beam angle of a light source emitted from a light-emitting diode (LED) element by: arranging a phosphor layer formed in the shape of a cap and having side and top portions of a uniform thickness to surround the side surfaces and the top surface of the LED element while being spaced apart therefrom, and arranging the LED element, gold wires, and bonding pads of a substrate under the phosphor layer cap.

Another object of the present invention is to provide a method of manufacturing a light-emitting device package, which can efficiently improve processing throughput of the light-emitting device package described above.

Technical objects to be achieved by the present invention are not limited to the aforementioned objects, and other technical objects that have not been described above will become evident to those skilled in the art to which the present invention pertains from the following description.

According to an embodiment of the present invention, there is provided a light-emitting diode (LED) package including: a substrate on which a set of bonding pads are formed; an LED element configured to provide light of a wavelength of a predetermined region, having a set of chip pads formed on a top surface thereof and being attached on a top surface of the substrate; a set of gold wires, each connecting a bonding pad of the set of bonding pads with one chip pad of the set of chip pads of the light-emitting diode element; a phosphor layer formed in a shape of a cap having side and top portions of a uniform thickness and being configured to surround side surfaces and a top surface of the LED element while being spaced apart therefrom; and a filler disposed to fill a space formed between the phosphor layer and the LED element, wherein the LED element, the gold wires, and the bonding pads of the substrate are under the phosphor layer cap.

In the LED package according to an embodiment of the present invention, the phosphor layer may be formed of phosphor and silicon.

In the LED package according to an embodiment of the present invention, the filler may be formed of silicon.

In the LED package according to an embodiment of the present invention, a distance between the top surface of the LED and the phosphor layer may be between approximately 10 μm and 500 μm.

In the LED package according to an embodiment of the present invention, a distance between the side surface of the LED and the phosphor layer may be between approximately 10 μm and 1,000 μm.

In the LED package according to an embodiment of the present invention, the uniform thickness of the phosphor layer may be between approximately 20 μm and 200 μm.

According to another embodiment of the present invention, there is provided a method of manufacturing a light-emitting diode (LED) package, the method including the steps of: mounting an LED element on a substrate on which a set of bonding pads are formed, the LED element being configured to provide light of a wavelength of a predetermined region and having a set of chip pads formed on a top surface thereof; wire-bonding each of the set of bonding pads of the substrate to one of the set of chip pads of the light-emitting diode element using gold wires; dotting a filler in a liquid phase on a top of the LED element; arranging a phosphor layer formed in a shape of a cap, and having side and top portions of a uniform thickness, configured to surround the top of the LED element on which the filler is dotted while being spaced apart therefrom; and baking the LED element mounted on the substrate, the phosphor layer surrounding the gold wires, the set of bonding pads, and the filler, wherein the LED element, the gold wires, and the bonding pads of the substrate are arranged under the phosphor layer cap.

In the method of manufacturing an LED package according to an embodiment of the present invention, the phosphor layer may be formed of phosphor and silicon.

In the method of manufacturing an LED package according to an embodiment of the present invention, the filler in a liquid phase may be silicon.

In the method of manufacturing an LED package according to an embodiment of the present invention, a distance between the top surface of the LED and the phosphor layer may be between approximately 10 μm and 500 μm.

In the method of manufacturing an LED package according to an embodiment of the present invention, a distance between the side surface of the LED and the phosphor layer may be between approximately 10 μm and 1,000 μm.

In the method of manufacturing an LED package according to an embodiment of the present invention, the uniform thickness of the phosphor layer may be between approximately 20 μm and 200 μm.

BRIEF DESCRIPTION OF THE DRAWINGS

These and other features of this invention will be more readily understood from the following detailed description of the various aspects of the invention taken in conjunction with the accompanying drawings in which.

Figure 1:
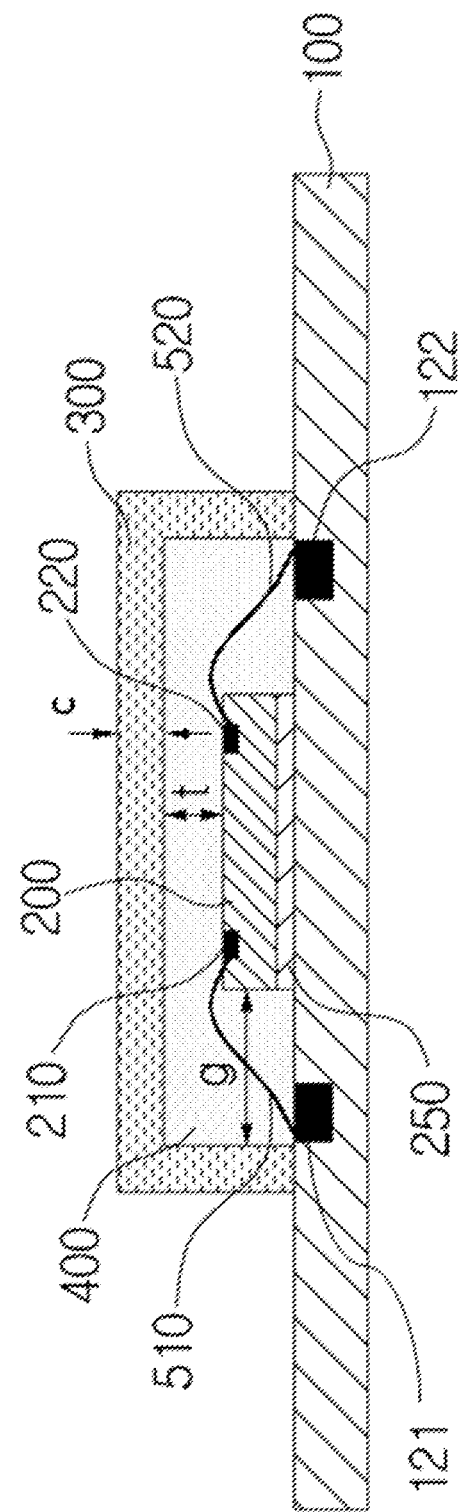
FIG. 1 is a cross-sectional view showing a light-emitting device package according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Illustrative embodiments will now be described more fully herein with reference to the accompanying drawings, in which illustrative embodiments are shown. It will be appreciated that this disclosure may be embodied in many different forms and should not be construed as limited to the illustrative embodiments set forth herein. Rather, these illustrative embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, are interchangeable and specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments", "in some embodiments," and similar language throughout this specification may, but do not necessarily, all refer to the same embodiment. It will be understood that one skilled in the art may cross embodiments by "mixing and matching" one or more features of one embodiment with one or more features of another embodiment.

As indicated above, approaches for a light-emitting device package and a method of manufacturing thereof are provided. In a typical embodiment, this light-emitting device package and a method of manufacturing thereof can effectively suppress a hot spot phenomenon, while effectively increasing a beam angle of a light source emitted from a light-emitting diode (LED) element or chip, and efficiently improve processing throughput of the light-emitting device package. This is achieved in part by arranging a phosphor layer formed in the shape of a cap and having side and top portions of a uniform thickness to surround the side surfaces and the top surface of the LED element while being spaced apart therefrom. Furthermore, the LED element, the gold wires, and the bonding pads of the substrate may be arranged under the phosphor layer cap.

As shown in FIG. 1, a light-emitting device package according to an embodiment of the present invention is configured to include a light-emitting diode (LED) element or chip 200, a substrate 100 or base pad, a phosphor layer 300, gold wires 510 and 520, and a filler 400.

In some embodiments, bonding pads 121 and 122 are formed on the substrate 100. In an embodiment, the LED element 200 is configured to provide light of a wavelength of a predetermined region. The LED element 200 may have chip pads 210 and 220 formed on the top surface. In an illustrative embodiment, for example, the LED element 200 may be an LED element 200 configured to provide light of a blue wavelength or an LED element 200 configured to provide light of an ultraviolet wavelength.

Meanwhile, in some embodiments, the phosphor layer 300 is formed substantially in the shape of a cap having side portions and a top portion in order to surround: the side surfaces and the top surface of the LED element 200, the gold wires 510 and 520, and the bonding pads 121 and 122 of the substrate 100, while also being spaced apart therefrom (e.g., disposed over and around but not in contact). In some embodiments, the side portions and the top portion of the phosphor layer 300 have a uniform thickness or a substantially uniform thickness. Furthermore, the light provided by the LED element 200 may be converted into white light by the phosphor layer 300 by shifting the wavelength of the light emitted from a side or top surface of the LED element 200 in embodiments in which the side and top portions of the phosphor layer 300 are formed in a uniform thickness (i.e. equally thick). In some embodiments, a uniform thickness "c" of the phosphor layer 300 is between approximately 20 μm and 200 μm. In some embodiments, the phosphor layer 300 may be formed, for example, of phosphor and silicon or the like.

Although only depicted as a cross-section in FIG. 1, it should be noted that LED element 200 is three-dimensional and may be four-sided, multi-sided, round-sided, etc. Likewise, although phosphor layer 300 is only depicted as a cross-section in FIG. 1, it too is three-dimensional and may be four-sided, multi-sided, round-sided, etc.

The gold wires 510 and 520, in an embodiment, electrically connect the bonding pads 121 and 122 of the substrate 100 to the chip pads 210 and 220, respectively, of the LED element 200. In some embodiments, the LED element 200, the gold wires 510 and 520, and the bonding pads 121 and 122 of the substrate 100 are arranged under the cap of phosphor layer 300. The filler 400 may be disposed in the space formed between the phosphor layer 300 and the LED element 200 and in some embodiments, may be formed of silicon or the like.

In some embodiments, a distance "t" between the top surface of the LED element 200 and the underside of the top portion of the phosphor layer 300 is between approximately 10 μm and 500 μm. In another embodiment, a distance "g" between a side surface of the LED element 200 and a side portion of the phosphor layer 300 is between approximately 10 μm and 1,000 μm.

As discussed above, the light-emitting device package according to embodiments of the present invention offers several improvements over current solutions by providing a light-emitting device package that effectively suppresses a hot spot phenomenon while effectively increasing a beam angle of a light source emitted from an LED element 200. This is achieved in part by arranging a phosphor layer 300 formed in the shape of a cap and having side and top portions of a uniform thickness to surround the side surfaces and the top surface of the LED element 200 while being spaced apart therefrom, and furthermore arranging the LED element, gold wires, and bonding pads of a substrate under the phosphor layer cap.

Hereinafter, a method of making or manufacturing an LED package according to an embodiment of the present invention will be described with reference to FIGS. 2A, 2B, and 2C.

Figure 2A:
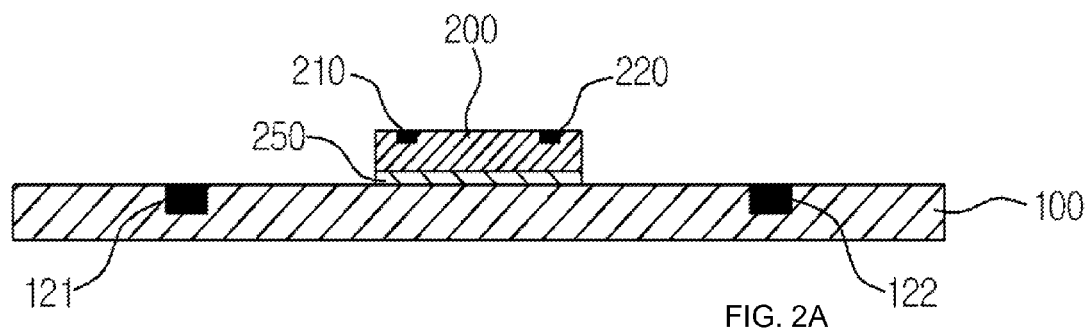
FIGS. 2A, 2B, and 2C are cross-sectional views showing a process of making the light-emitting device package of FIG. 1.

As shown in FIG. 2A, an LED element or chip 200 configured to provide light of a wavelength of a predetermined region and having chip pads 210 and 220 formed on the top surface thereof is mounted on a substrate 100 on which bonding pads 121 and 122 are formed. In some embodiments, the LED element 200 is mounted on the substrate 100 using a paste 250.

Figure 2B:
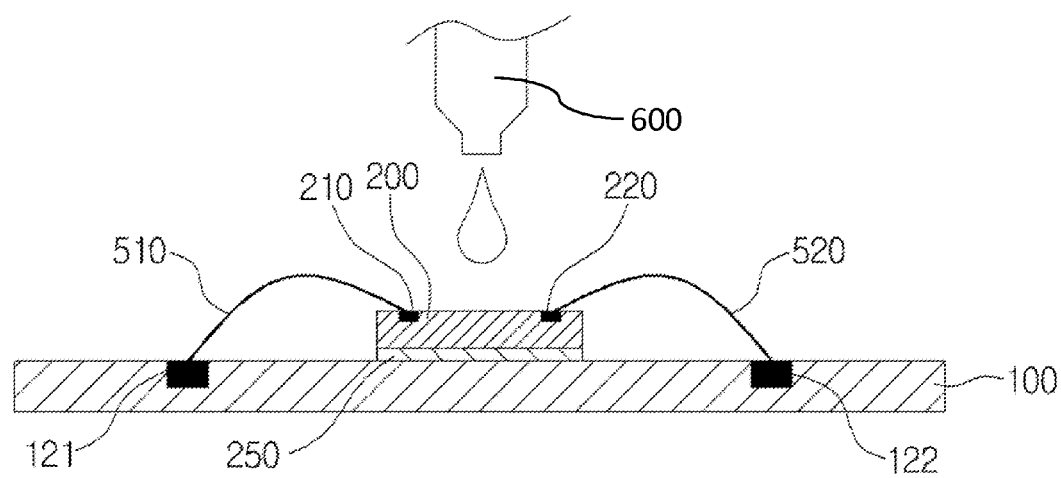

As shown in FIG. 2B, in some embodiments, each one of the bonding pads 121 and 122 of the substrate 100 are wire-bonded to one of the chip pads 210 and 220 of the LED element 200 using gold wires 510 and 520, respectively.

In some embodiments, a filler 400 in a liquid phase is dotted on the top of the LED element 200. The filler 400 may be dotted on a top of LED element 200 by a dispenser or applicator 600. After dispensing filler 400, a phosphor layer 300, formed in the shape of a cap and having side and top portions of a uniform thickness, is arranged to surround the top and/or sides of the LED element 200, on which the filler 400 is dotted, while being spaced apart therefrom. Furthermore, in some embodiments, the LED element 200, the gold wires 510 and 520, and the bonding pads 121 and 122 of the substrate 100 are arranged under the phosphor layer cap.

Figure 2C:
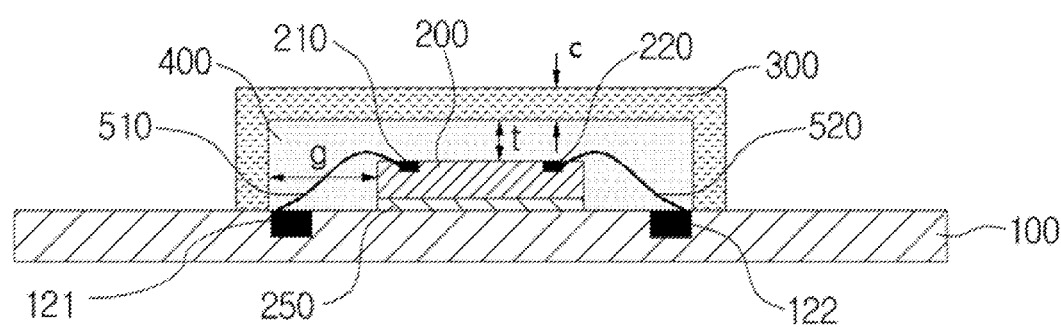

In further embodiments, as shown in FIG. 2C, the LED element 200 mounted on the substrate 100, the phosphor layer 300 surrounding the gold wires 510 and 520 and the bonding pads 121 and 122 of the substrate 100, and the filler 400 placed between the LED element 200 and the phosphor layer 300 are baked to yield a completed light-emitting device package. It will be understood by those trained in the art that that the light-emitting device package may be baked via any process or method now known or later discovered.

In some embodiments, the phosphor layer 300 may be formed of phosphor and silicon. In further embodiments, the filler 400 in a liquid phase may be comprised of silicon. In still yet another embodiment, a distance "t" between the top surface of the LED element 200 and the underside of the top portion of the phosphor layer 300 is between approximately 10 μm and 500 μm. In another embodiment, a distance "g" between a side surface of the LED element 200 and a side portion of the phosphor layer 300 is between approximately 10 μm and 1,000 μm. In still further embodiments, a thickness "c" of the phosphor layer 300 is between approximately 20 μm and 200 μm and the phosphor layer 300 may be formed, for example, of phosphor and silicon or the like.

As discussed above, the method of manufacturing a light-emitting device package according to embodiments of the present invention offers several improvements current solutions by providing a method of manufacturing a light-emitting device package that effectively improves processing throughput while effectively decreasing processing steps by arranging an LED element 200, gold wires 510 and 520, and bonding pads 121 and 122 of a substrate 100 under a cap of phosphor layer 300 as described above.

Although described and shown above in relation to illustrative embodiments in order to illustrate principles of the present invention, the present invention is not limited to the aforementioned configurations and operations. Rather, those skilled in the art will appreciate that the present invention may be modified and changed in various ways without departing from the scope and spirit of the presently claimed invention. Accordingly, all proper changes, modifications, and equivalents thereof should be construed as included in the scope of the present invention.

What is claimed is:

1. A light-emitting diode (LED) package comprising:
   a substrate on which a set of bonding pads are formed;
   a light-emitting diode element configured to provide light of a wavelength of a predetermined region, having a set of chip pads formed on a top surface thereof and being attached on a top surface of the substrate;
   a set of gold wires, each connecting a bonding pad of the set of bonding pads with one chip pad of the set of chip pads of the light-emitting diode element;
   a phosphor layer formed in a shape of a cap having side and top portions of a uniform thickness and being configured to surround side surfaces and a top surface of the light-emitting diode element while being spaced apart therefrom; and
   a filler disposed to fill a space formed between the phosphor layer and the light-emitting diode element,
   wherein the light-emitting diode element, the set of gold wires, and the set of bonding pads of the substrate are under the phosphor layer cap.

2. The LED package according to claim 1, wherein the phosphor layer is formed of phosphor and silicon.

3. The LED package according to claim 1, wherein the filler is formed of silicon.

4. The LED package according to claim 1, wherein a distance between the top surface of the light-emitting diode and the phosphor layer is between approximately 10 μm and 500 μm.

5. The LED package according to claim 1, wherein a distance between the side surface of the light-emitting diode and the phosphor layer is between approximately 10 μm and 1,000 μm.

6. The LED package according to claim 1, wherein the uniform thickness of the phosphor layer is between approximately 20 μm and 200 μm.

7. A method of manufacturing a light-emitting diode package, the method comprising:
    mounting a light-emitting diode element on a substrate on which a set of bonding pads are formed, the light-emitting diode element being configured to provide light of a wavelength of a predetermined region and having a set of chip pads formed on a top surface thereof;
    wire-bonding each of the set of bonding pads of the substrate to one of the set of chip pads of the light-emitting diode element using gold wires;
    dotting a filler in a liquid phase on a top of the light-emitting diode element;
    arranging a phosphor layer formed in a shape of a cap, and having side and top portions of a uniform thickness, configured to surround the top of the light-emitting diode element on which the filler is dotted while being spaced apart therefrom; and
    baking the light-emitting diode element mounted on the substrate, the phosphor layer surrounding the gold wires, the set of bonding pads, and the filler,
    wherein the light-emitting diode element, the gold wires and the set of bonding pads of the substrate are arranged under the phosphor layer cap.

8. The method according to claim 7, wherein the phosphor layer is formed of phosphor and silicon.

9. The method according to claim 7, wherein the filler in a liquid phase is silicon.

10. The method according to claim 7, wherein a distance between the top surface of the light-emitting diode and the phosphor layer is between approximately 10 μm and 500 μm.

11. The method according to claim 7, wherein a distance between the side surface of the light-emitting diode and the phosphor layer is between approximately 10 μm and 1,000 μm.

12. The method according to claim 7, wherein the uniform thickness of the phosphor layer is between approximately 20 μm and 200 μm.

* * * * *